US009601054B2

United States Patent
Shimayama

(10) Patent No.: US 9,601,054 B2
(45) Date of Patent: Mar. 21, 2017

(54) DISPLAY DEVICE, MANUFACTURING METHOD, AND ELECTRONIC APPARATUS

(71) Applicant: Sony Corporation, Tokyo (JP)

(72) Inventor: Tsutomu Shimayama, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/402,326

(22) PCT Filed: May 8, 2013

(86) PCT No.: PCT/JP2013/062889
§ 371 (c)(1),
(2) Date: Nov. 20, 2014

(87) PCT Pub. No.: WO2013/183393
PCT Pub. Date: Dec. 12, 2013

(65) Prior Publication Data
US 2015/0097494 A1    Apr. 9, 2015

(30) Foreign Application Priority Data

Jun. 8, 2012  (JP) ................................. 2012-131029

(51) Int. Cl.
*G09G 3/3233*   (2016.01)
*H01L 27/12*    (2006.01)
(Continued)

(52) U.S. Cl.
CPC ......... *G09G 3/3233* (2013.01); *H01L 27/127* (2013.01); *H01L 51/56* (2013.01); *G09G 2300/0819* (2013.01); *G09G 2320/0219* (2013.01); *G09G 2320/0233* (2013.01); *G09G 2320/045* (2013.01); *H01L 27/1296* (2013.01); *H01L 2227/323* (2013.01)

(58) Field of Classification Search
CPC ...... G09G 3/3233; H01L 27/127; H01L 51/56
USPC ........................................................ 315/224
See application file for complete search history.

(56) References Cited

U.S. PATENT DOCUMENTS 9,202,412 B2 * 12/2015 Odawara .............. G09G 3/3233
2004/0189883 A1 * 9/2004 Koyama ................ G02F 1/1368
349/33

(Continued)

FOREIGN PATENT DOCUMENTS

CN    102222463    10/2011
CN    102243840    11/2011

(Continued)

OTHER PUBLICATIONS

Chinese Patent Office Action dated May 5, 2016 corresponding to Chinese Application No. 201380024040.3.

*Primary Examiner* — Dylan White
(74) *Attorney, Agent, or Firm* — Dentons US LLP

(57) ABSTRACT

There is provided a display device including a pixel array unit in which a plurality of pixels are arrayed in a matrix shape. A predetermined amount of light emission variation is added to a light emission state of each pixel and a cycle of the light emission state of the pixel array unit in the case of the addition is shorter than the cycle of a light emission state of the pixel array unit before the predetermined amount of light emission variation is added.

17 Claims, 15 Drawing Sheets

(51) Int. Cl.
*H01L 51/56* (2006.01)
*G09G 3/32* (2016.01)

(56) References Cited

U.S. PATENT DOCUMENTS

| | | | | |
|---|---|---|---|---|
| 2004/0227703 | A1* | 11/2004 | Lamvik | G02B 27/0172 345/76 |
| 2007/0171216 | A1* | 7/2007 | Kawaura | G09G 3/3685 345/204 |
| 2008/0149931 | A1 | 6/2008 | Koyama | |
| 2009/0122090 | A1* | 5/2009 | Jo | G09G 3/3233 345/690 |
| 2009/0256854 | A1* | 10/2009 | Mizukoshi | G09G 3/3233 345/589 |
| 2010/0265237 | A1* | 10/2010 | Tsuge | G09G 3/3233 345/211 |
| 2010/0289793 | A1* | 11/2010 | Yamamoto | G09G 3/3233 345/213 |
| 2015/0339979 | A1* | 11/2015 | Kikuchi | G09G 3/32 345/213 |

FOREIGN PATENT DOCUMENTS

| | | |
|---|---|---|
| JP | 10-039791 | 2/1998 |
| JP | 2003-323130 | 11/2003 |
| JP | 2004-212557 | 7/2004 |
| JP | 2004-333723 | 11/2004 |
| JP | 2005-222030 | 8/2005 |
| JP | 2007-219496 | 8/2007 |
| JP | 2009-169339 | 7/2009 |
| WO | WO/2011/152496 A1 | 12/2011 |

\* cited by examiner

FIG. 4
A
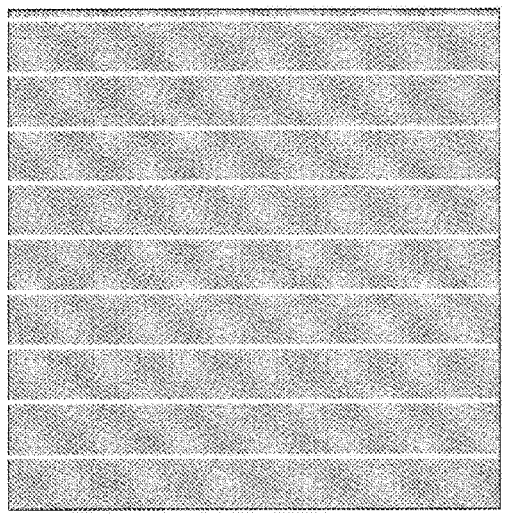
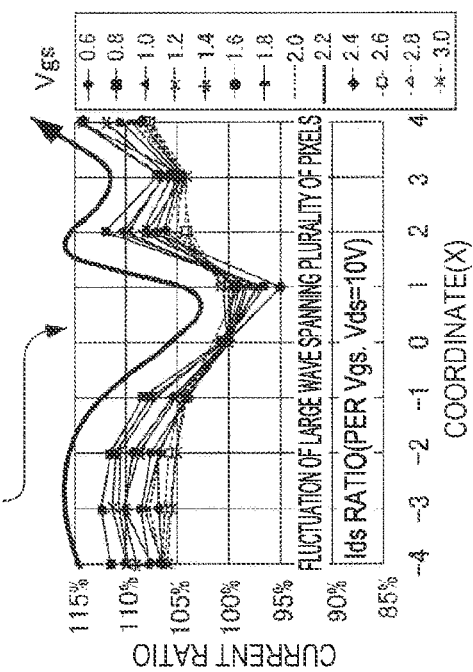
B
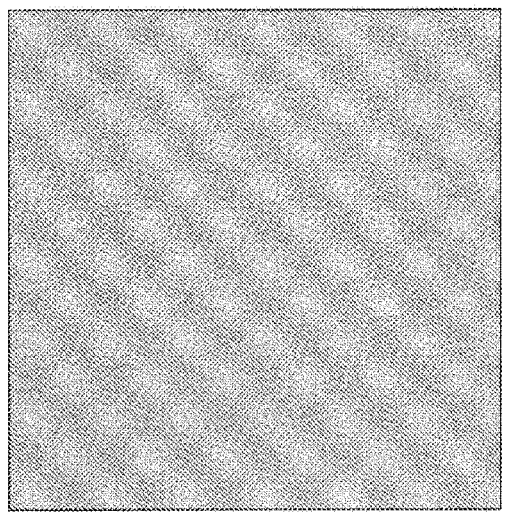
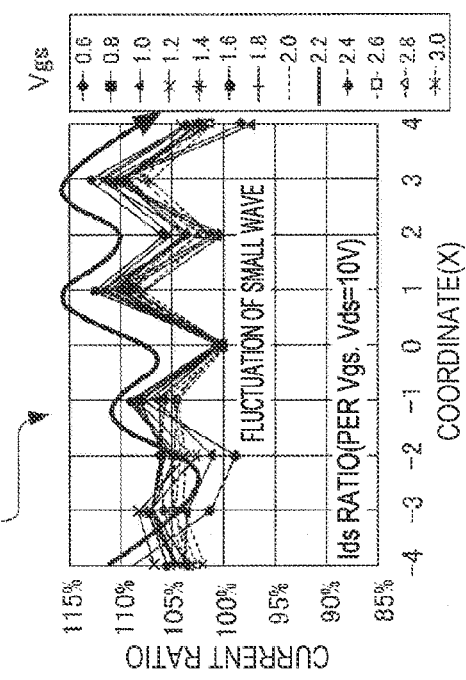

CHANGE OF ENERGY OF ELA (A ≠ B)

CHANGE OF LENGTH OF W(A≠B)

CHANGE OF PIXEL WIDTH

CHANGE OF TRANSMITTANCE
OF COLOR FILTER

FIG. 12
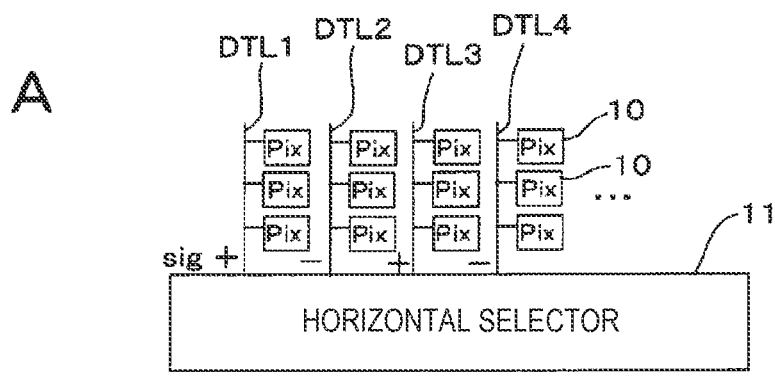
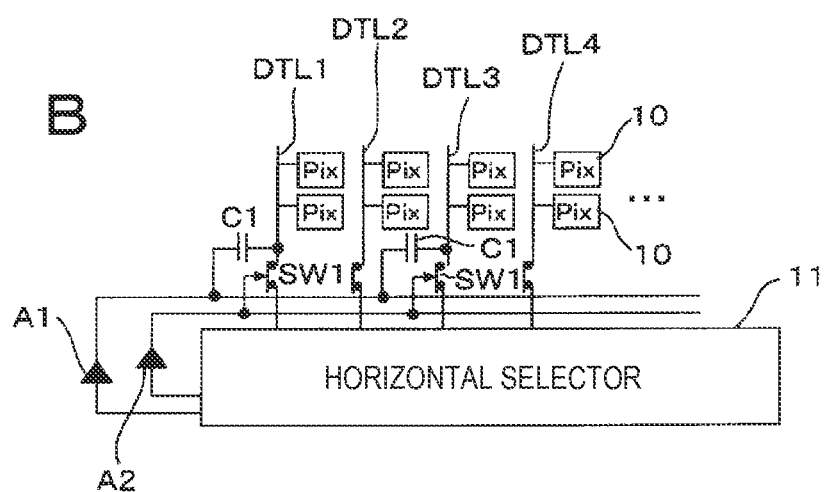

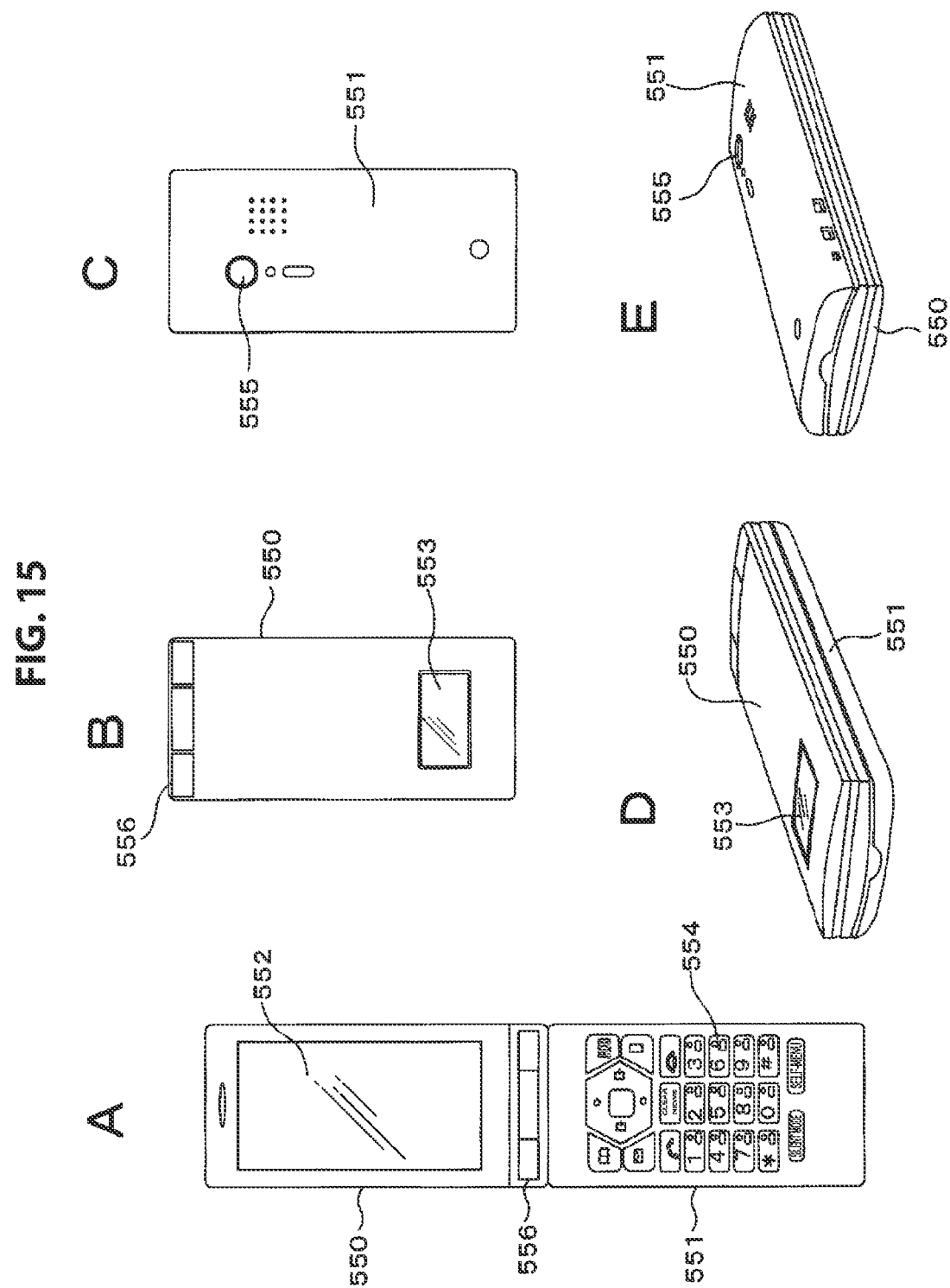

200

DISPLAY DEVICE, MANUFACTURING METHOD, AND ELECTRONIC APPARATUS

TECHNICAL FIELD

The present disclosure relates to a display device, a display method, and an electronic apparatus that prevent occurrence of interference fringes appearing on a screen.

CITATION LIST

Patent Literature

Patent Literature 1: JP 2004-333723A

BACKGROUND ART

In recent years, flat displays such as organic EL display devices have been widely used.

An organic EL (Electro Luminescence) element has advantages such as high visibility due to self-coloring, excellent resistance to impact since it is an all-solid-state display unlike a liquid crystal display device, a high response speed, little influence from changes in temperature, a wide viewing angle, and the like, and thus use of the element as a light emitting element in a display device has been receiving attention.

In an organic EL display, like a liquid crystal display, driving methods include a simple matrix method and an active matrix method. While the former has a simple structure, it has problems of difficulty realizing large-scale and high-definition display, and thus the active matrix method is currently being actively developed. In this method, a current flowing into a light emitting element inside each pixel circuit is controlled by an active element (generally, a thin-film transistor (TFT)) provided inside the pixel circuit.

SUMMARY OF INVENTION

Technical Problem

In such a flat display, however, interference fringes caused by variation of a light emission state of each pixel (light emission unevenness) are observed. The interference fringes are a cause of blurry images and poor visibility.

Patent Literature 1 discloses a configuration in which positions of the centers of gravity of a plurality of pixels are set to be aperiodic in order to suppress interference fringes of a flat display.

The present disclosure aims to provide a display device that makes interference fringes difficult to see and further has high visibility.

Solution to Problem

According to the present disclosure, there is provided a display device including a pixel array unit in which a plurality of pixels are arrayed in a matrix shape. A predetermined amount of light emission variation is added to a light emission state of each pixel and a cycle of the light emission state of the pixel array unit in the case of the addition is shorter than the cycle of a light emission state of the pixel array unit before the predetermined amount of light emission variation is added.

In addition, an electronic apparatus according to the present disclosure includes such display device.

According to the present disclosure, there is provided a manufacturing method of a display device including a pixel array unit in which a plurality of pixels are arrayed in a matrix shape, the method including a step of adding a predetermined amount of light emission variation to a light emission state of each pixel and setting a cycle of the light emission state of the pixel array unit in the case of the addition to be shorter than the cycle of a light emission state of the pixel array unit before the predetermined amount of light emission variation is added.

In the technology of the present disclosure described above, interference fringes are difficult to recognize since a cycle of a light emission state of each pixel is short.

Advantageous Effects of Invention

According to the present disclosure, there is an effect of realizing a display device that makes interference fringes difficult to see and further has high visibility.

BRIEF DESCRIPTION OF DRAWINGS

FIG. 4 is an illustrative diagram showing a correlation between interference fringes and a cycle of fluctuation in a driving current of a driving transistor.

FIG. 12 is a diagram showing a method of changing a signal voltage from a horizontal selector.

FIG. 15 is an illustrative diagram of an electronic apparatus as an application example of an embodiment.

DESCRIPTION OF EMBODIMENTS

Hereinafter, the embodiments will be described in the following order.

<1. Overview of an organic EL display device>
<2. Regarding occurrence of interference fringes>
<3. Regarding an MTF of a human eye>
<4. Embodiments>
<4-1. Change of a characteristic of a driving transistor using an excimer laser>
<4-2. Change of a channel width of a driving transistor>
<4-3. Change of a pixel width>
<4-4. Change of the transmittance of color filters>

<4-5. Change of a signal voltage using a horizontal selector>

<5. Application examples to other electronic apparatuses and a modified example>

1. Overview of an Organic EL Display Device

Figure 1:
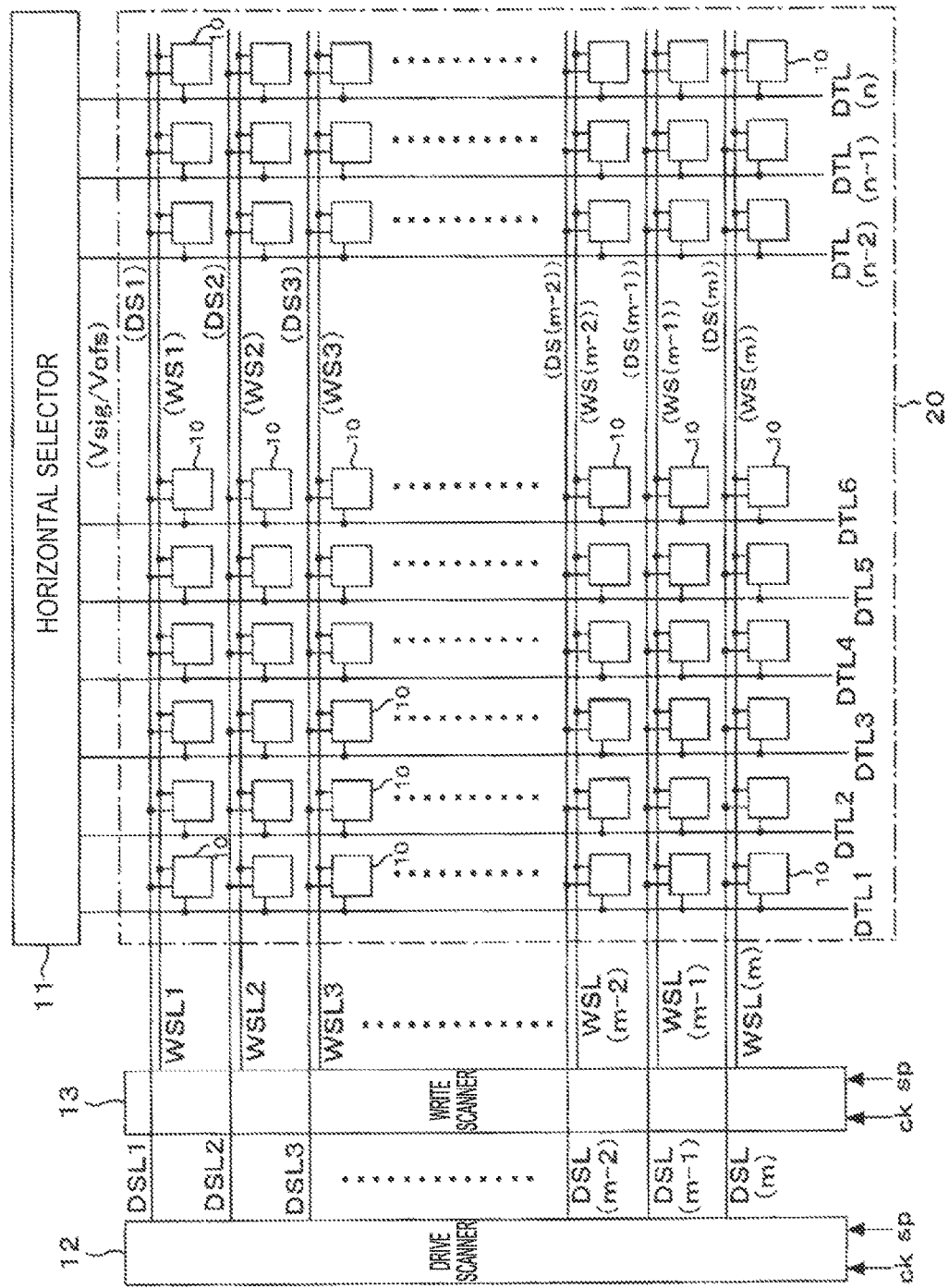
FIG. 1 is an illustrative diagram of a configuration of a display device of an embodiment.

An overview of an organic EL display device will be described using an example thereof in FIG. 1 as an embodiment of a display device. FIG. 1 shows a configuration of the organic EL display device.

As shown in FIG. 1, the organic EL display device has light emitting elements as organic EL elements and includes pixel circuits 10 that drive light emission using the active matrix method.

As shown in the drawing, the organic EL display device has a pixel array 20 in which a number of pixel circuits 10 are arrayed in a column direction and a row direction (m rows×n columns) forming a matrix shape. Note that each of the pixel circuits 10 serves as a light emitting element of any color of R (red), G (green), and B (blue), and accordingly the pixel circuits 10 of the colors are arrayed under a predetermined rule and constitute a color display device.

As a configuration for driving light emission of each of the pixel circuits 10, a horizontal selector 11, a drive scanner 12, and a write scanner 13 are provided.

In addition, signal lines DTL1, DTL2, . . . , DTL(n) which are selected by the horizontal selector 11 and supply a voltage according to a signal value (grayscale value) of a luminance signal as display data to the pixel circuits 10 are disposed on the pixel array in the column direction. The signal lines DTL1, DTL2, . . . , DTL(n) are disposed to be equal in number to the columns (n columns) of the pixel circuits 10 which are disposed in a matrix shape in the pixel array 20.

In addition, in the pixel array 20, writing control lines WSL1, WSL2, . . . , WSL(m) and power supply control lines DSL1, DSL2, . . . , DSL(m) are disposed in the row direction. The writing control lines WSL and the power supply control lines DSL are both disposed to be equal in number to the rows (m rows) of the pixel circuits 10 arrayed in the matrix shape on the pixel array 20.

The writing control lines WSL (WSL1 to WSL(m)) are driven by the write scanner 13.

The write scanner 13 supplies scanning pulses WS (WS1, WS2, . . . , WS(m)) sequentially to each of the writing control lines WSL1 to WSL(m) which are embedded in a row shape at set predetermined timings, and thereby performs line sequential scanning on the pixel circuits 10 in units of rows.

The power supply control lines DSL (DSL1 to DSL(m)) are driven by the drive scanner 12. The drive scanner 12 supplies power supply pulses DS (DS1, DS2, . . . , DS(m)) to each of the power supply control lines DSL1 to DSL(m) which are embedded in a row shape in accordance with the line sequential scanning performed by the write scanner 13. The power supply pulses DS (DS1, DS2, . . . , DS(m)) are set to be pulse voltages switching to three values of a drive voltage Vcc, an initial voltage Vini, and a light emission pause voltage Vm.

Note that the drive scanner 12 and the write scanner 13 set timings of the power supply pulses DS and the scanning pulses WS based on a clock ck and a start pulse sp.

The horizontal selector 11 supplies signal line voltages serving as input signals for the pixel circuits 10 to the signal lines DTL1, DTL2, . . . which are disposed in the column direction in accordance with the line sequential scanning performed by the write scanner 13. In the present embodiment, the horizontal selector 11 supplies a reference voltage Vofs to be used in correction of a threshold value and a video signal voltage Vsig that is a voltage according to a grayscale of video data to each signal line as signal line voltages in a time division manner.

Figure 2:
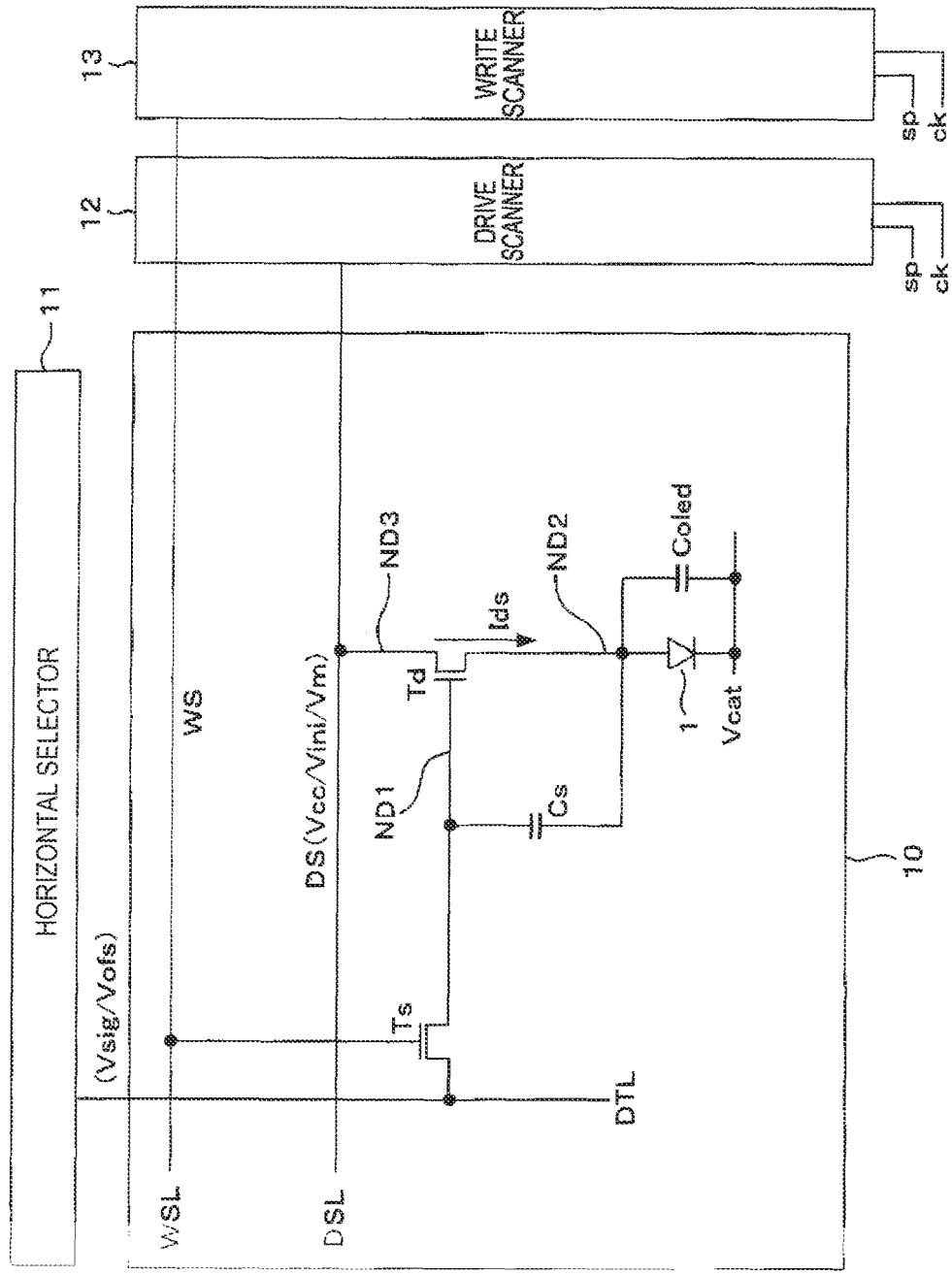
FIG. 2 is a circuit diagram of a pixel circuit of an embodiment.

FIG. 2 shows a configuration example of one of the pixel circuits 10 of an embodiment. The pixel circuits 10 are arrayed in the matrix shape like the pixel circuits 10 of the configuration of FIG. 1.

Note that, for the sake of simplification, FIG. 2 only shows one pixel circuit 10 disposed in the intersection portions of a signal line DTL and a writing control line WSL and a power supply control line DSL.

The pixel circuit 10 is constituted by having an organic EL element 1 which is a light emitting element, a retention capacitor Cs, a sampling transistor Ts, and a driving transistor Td. Note that a capacitor Coled is a parasitic capacitor of the organic EL element 1.

The sampling transistor Ts and the driving transistor Td are each constituted by a thin-film transistor with an n channel.

One terminal of the retention capacitor Cs is connected to the source (node ND2) of the driving transistor Td, and the other terminal thereof is also connected to the gate (node ND1) of the driving transistor Td.

The drain of the driving transistor Td is connected to the power supply control line DSL which corresponds to the row of the pixel circuit 10. The connection point of the power supply control line DSL and the driving transistor Td is set to be a node ND3.

The light emitting element of the pixel circuit 10 is set to be, for example, the organic EL element 1 of a diode structure having the anode and the cathode. The anode of the organic EL element 1 is connected to the source of the driving transistor Td, and the cathode thereof is connected to a predetermined wire (a cathode voltage Vcat).

The source and the drain of the sampling transistor Ts are connected between the signal line DTL and the gate (node ND1) of the driving transistor Td in series.

Thus, when the sampling transistor Ts is in conduction, the gate of the driving transistor Td is configured such that a signal line voltage (the video signal voltage Vsig or a reference voltage Vofs) of the signal line DTL is input thereto.

The gate of the sampling transistor Ts is connected to the writing control line WSL which corresponds to the row of the pixel circuit 10.

Driving of light emission of the organic EL element 1 is basically performed as follows.

At a timing at which the video signal voltage Vsig is applied to the signal line DTL, the sampling transistor Ts becomes conductive due to a scanning pulse WS given from the write scanner 13 via the writing control line WSL. Accordingly, the video signal voltage Vsig from the signal line DTL is written in the retention capacitor Cs.

The driving transistor Td causes a current Ids to flow into the organic EL element 1 in the event of current supply from the power supply control line DSL to which a drive voltage Vcc is applied by the drive scanner 12, and thereby causes the organic EL element 1 to emit light.

At this time, the current Ids of that moment has a value according to an inter-gate-source voltage Vgs of the driving transistor Td (a value according to a voltage retained by the retention capacitor Cs), and thereby the organic EL element 1 emits light with luminance according to the value of the current.

In other words, in the case of the pixel circuit 10, by writing the video signal voltage Vsig supplied from the signal line DTL in the retention capacitor Cs, the voltage applied to the gate of the driving transistor Td is changed, the value of the current flowing into the organic EL element 1 is accordingly controlled, and thereby grayscales of the light emission are obtained.

Since the driving transistor Td is designed so as to be operated in a saturation region at all times, the driving transistor Td serves as a constant current source having the value shown in the following formula 1.

$$Ids = (1/2) \cdot \mu \cdot (W/L) \cdot Cox \cdot (Vgs - Vth)^2 \quad \text{(formula 1)}$$

Here, Ids represents a current flowing between the drain and the source of a transistor operating in the saturation region, μ represents a degree of movement, W represents a channel width, L represents a channel length, Cox represents a gate capacitance, and Vth represents a threshold voltage of the driving transistor Td.

As is obvious from formula 1, the drain current Ids is controlled by the inter-gate-source voltage Vgs in the saturation region. Since the inter-gate-source voltage Vgs is retained constantly, the driving transistor Td can operate as the constant current source causing the organic EL element 1 to emit light with constant luminance.

As described above, basically, an operation of writing the video signal voltage (grayscale value) Vsig in the retention capacitor Cs is performed in the pixel circuit 10 in each frame period, and the inter-gate-source voltage Vgs of the driving transistor Td is decided according to a grayscale to be displayed accordingly.

Then, by operating in the saturation region, the driving transistor Td functions as the constant current source for the organic EL element 1, and by causing a current according to the inter-gate-source voltage Vgs to flow into the organic EL element 1, the organic EL element 1 emits light with luminance according to the grayscale value of the video signal in each frame period.

Herein, for understanding of the present disclosure, a basic operation of the pixel circuit 10 will be described. This is a circuit operation that includes a threshold value correction operation and a movement degree correction operation for compensating the threshold value of the driving transistor Td of each pixel circuit 10 and deterioration of uniformity caused by variation in degrees of movement.

Note that, in the pixel circuit operation, the threshold value correction operation and the movement degree correction operation have been performed in the past, and thus the necessity thereof will be briefly described.

For example, in a pixel circuit that uses a polysilicon TFT or the like, there are cases in which the threshold voltage Vth of the driving transistor Td and a degree of movement μ of a semiconductor thin film constituting the channel of the driving transistor Td change as time elapses. In addition, the transistor characteristics such as the threshold voltage Vth and the degree of movement μ may differ among pixels due to variation in the manufacturing process.

If the threshold voltage and the degree of movement of the driving transistor Td differ among pixels, variation in the value of a current flowing into the driving transistor Td occurs in each pixel. For this reason, even if the same video signal value (video signal voltage Vsig) is given to all of the pixel circuits 10, variation in luminance of light emission of the organic EL element 1 occurs in each pixel, and as a result, uniformity (homogeneity) of a screen is impaired.

Due to the above fact, in the operation of the pixel circuits, the pixel circuits are designed to have the correction function for changes of the threshold voltage Vth and the degree of movement μ.

Figure 3:
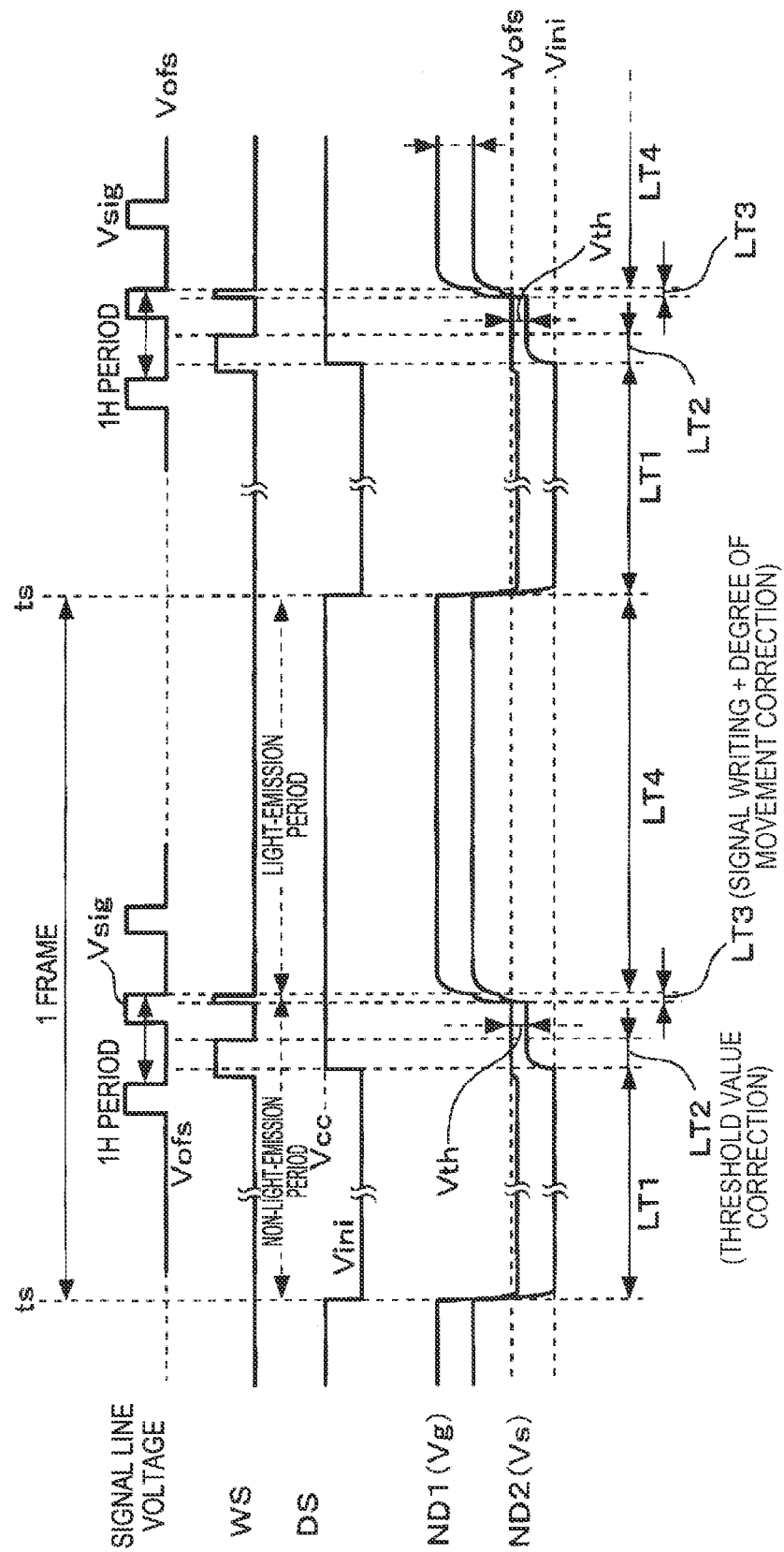
FIG. 3 is an illustrative diagram of an operation of the pixel circuit.

FIG. 3 shows a timing chart of an operation of a light emission cycle (each frame period) of the pixel circuit 10.

In FIG. 3, signal line voltages given by the horizontal selector 11 to the signal line DTL are shown. In the case of this operation example, the horizontal selector 11 gives a threshold value correction reference voltage Vofs as a single predetermined voltage value and a pulse voltage as the video signal voltage Vsig to the signal line DTL as the signal line voltages in one horizontal period (1H).

In addition, in FIG. 3, a scanning pulse WS which is given to the gate of the sampling transistor Ts by the write scanner 13 through the writing control line WSL is shown. The sampling transistor Ts with the n channel becomes conductive when the scanning pulse WS is set to a high (H) level, and becomes non-conductive when the scanning pulse WS is set to a low (L) level.

In addition, in FIG. 3, a power supply pulse DS supplied from the drive scanner 12 through the power supply control line DSL is shown. A driving voltage Vcc and an initial voltage Vini are given as the power supply pulse DS.

In addition, in FIG. 3, changes of a gate voltage Vg and a source voltage Vs of the driving transistor Td are shown as voltages of the nodes ND1 and ND2 which are shown in FIG. 2.

A time point ts in the timing chart of FIG. 3 represents one cycle in which the organic EL element 1 that is a light emitting element is driven to emit light, for example, a start timing of one frame period of image display.

Light emission of the previous frame is performed before time reaches the time point ts.

In other words, a light emission state of the organic EL element 1 is a state in which the power supply pulse DS is the driving voltage Vcc and the sampling transistor Ts turns off. Since the driving transistor Td is designed to operate in the saturation region, at that moment, the current Ids flowing into the organic EL element 1 has the value shown in formula 1 described above according to the inter-gate-source voltage Vgs of the driving transistor Td.

An operation for light emission of the frame of this time is started at the time point ts.

The time from the time point ts to the next time point ts is, for example, the period in which the pixel circuit 10 performs a light emission operation of one cycle, as one frame period.

The period of one cycle is broadly divided into a non-light-emission period and a light-emission period. In FIG. 3, periods LT1, LT2, and LT3 are non-light-emission periods, and a period LT4 is the light-emission period.

In the period LT1, light-out and threshold value correction are prepared.

First, the power supply pulse DS=the initial voltage Vini is set.

At this time, if the initial voltage Vini is lower than the sum of a threshold voltage Vthel and a cathode voltage Vcat of the organic EL element 1, i.e., Vini≤Vthel+Vcat, light of the organic EL element 1 is out and a non-light-emission period is started. At this time, the power supply control line DSL turns into the source of the driving transistor Td. In addition, the anode (node ND2) of the organic EL element 1 is charged with the initial voltage Vini.

In addition, the gate voltage (of the node ND1) of the driving transistor Td becomes low according to a decrease of the source voltage.

After a certain period of time, threshold value correction is prepared

In other words, when the voltage of the signal line DTL is the threshold value correction reference voltage Vofs, the scanning pulse WS is set to a high (H) level, and the sampling transistor Ts turns on. For this reason, the gate (node ND1) of the driving transistor Td has the threshold value correction reference voltage Vofs.

The inter-gate-source voltage Vgs of the driving transistor Td=Vofs−Vini is set. Since it is not possible to perform a threshold value correction operation unless the outcome of Vofs−Vini is greater than the threshold voltage Vth of the driving transistor Td, the initial voltage Vini and the reference voltage Vofs are set such that Vofs−Vini>Vth is satisfied.

In other words, as preparation of the threshold value correction, the inter-gate-source voltage of the driving transistor is more sufficiently widened than the threshold voltage Vth.

Then, threshold value correction (Vth correction) is performed in the period LT2.

In other words, while the signal line voltage is the threshold value correction reference voltage Vofs, the write scanner 13 maintains the scanning pulse WS at the high (H) level. Then, the drive scanner 12 causes the power supply pulse DS to have the driving voltage Vcc.

In this case, the anode (node ND2) of the organic EL element 1 serves as the source of the driving transistor Td and a current flows. For this reason, with the gate (node ND1) of the driving transistor Td fixed to the threshold value correction reference voltage Vofs, the source node (node ND2) increases.

As long as the anode voltage (voltage of the node ND2) of the organic EL element 1 is equal to or lower than Vcat+Vthel (the threshold voltage of the organic EL element 1), the current of the driving transistor Td is used to charge the retention capacitor Cs, the parasitic capacitor Coled, and an auxiliary capacitor Csub. The phrase "as long as the anode voltage of the organic EL element 1 is equal to or lower than Vcat+Vthel" means that a leaking current of the organic EL element 1 is much smaller than the current flowing into the driving transistor Td.

For this reason, the voltage of the node ND2 (the source voltage of the driving transistor Td) gradually increases with time.

The threshold value correction is an operation of setting the inter-gate-source voltage of the driving transistor Td to the threshold voltage Vth. Thus, until the inter-gate-source voltage of the driving transistor Td reaches the threshold voltage Vth, the source voltage of the driving transistor Td increases.

After a certain period of time elapses, the inter-gate-source voltage of the driving transistor Td reaches the threshold voltage Vth.

Note that, although the threshold value correction operation is set to be performed once in this example, there are cases in which the threshold value correction operation is divided into a plurality of operations and performed in order to secure the time in which the inter-gate-source voltage of the driving transistor Td reaches the threshold voltage Vth.

At the time point at which the period LT2 ends, when the inter-gate-source voltage of the driving transistor Td reaches the threshold voltage Vth, the source voltage (of the node ND2; the anode voltage of the organic EL element 1)=Vofs−Vth≤Vcat+Vthel is set (Vcat is the cathode voltage and Vthel is the threshold voltage of the organic EL element 1.). At this time, the write scanner 13 sets the scanning pulse WS to the low (L) level, the sampling transistor Ts turns off, and thereby the threshold value correction operation is completed.

Then, in the period LT3 in which the signal line voltage reaches the video signal voltage Vsig, the write scanner 13 sets the scanning pulse WS to the high (H) level and writing of the video signal voltage Vsig and correction of the degree of movement are performed. In other words, the video signal voltage Vsig is input to the gate of the driving transistor Td.

The gate voltage of the driving transistor Td reaches the voltage of the video signal voltage Vsig, however, as the power supply control line DSL reaches the driving voltage Vcc, a current flows, and the source voltage gradually increases with time.

At this time, unless the source voltage of the driving transistor Td exceeds the sum of the threshold voltage Vthel and the cathode voltage Vcat of the organic EL element 1, the current of the driving transistor Td is used for charging the retention capacitor Cs, the parasitic capacitor Coled, and the auxiliary capacitor Csub. In other words, there is a condition that a leaking current of the organic EL element 1 be much smaller than the current flowing into the driving transistor Td.

In addition, at that time, because the threshold value correction operation of the driving transistor Td has been completed, the current flowing into the driving transistor Td turns into a current in which the degree of movement μ is reflected.

Specifically speaking, a current with a high degree of movement has a large amount at that time and the source also increases quickly. On the other hand, a current with a low degree of movement has a small amount and the source increases slowly.

Thus, in the period LT4 in which the scanning pulse WS is set to the high (H) level, the source voltage Vs of the driving transistor Td increases after the sampling transistor Ts turns on, and when the sampling transistor Ts turns off, the source voltage Vs turns into a voltage in which the degree of movement μ is reflected. The inter-gate-source voltage Vgs of the driving transistor Td is lowered because the voltage reflects the degree of movement, and then turns into the voltage which completely corrects the degree of movement after a certain period of time elapses.

As described above, after the writing of the video signal voltage Vsig and the correction of the degree of movement, the inter-gate-source voltage Vgs is confirmed, and then bootstrapping, or transition to a light emission state is performed.

In other words, the sampling transistor Ts turns off with the scanning pulse WS set to the low (L) level, then the writing is finished, and accordingly, the organic EL element 1 emits light.

In this case, the current Ids flows according to the inter-gate-source voltage Vgs of the driving transistor Td, the voltage of the node ND2 increases up to the voltage at which the current flows into the organic EL element 1, and thereby the organic EL element 1 emits light. At this moment, the sampling transistor Ts turns off, and at the same time with the increase of the voltage of the node ND2, the gate (node ND1) of the driving transistor Td increases as well, and thus the inter-gate-source voltage Vgs is maintained constant (bootstrapping operation).

As described above, a light-emission period, i.e., the period LT4, is started. Then, light emission of the organic EL element 1 continues until the start time point is of the next frame.

As described above, the pixel circuit 10 performs the operation for light emission of the organic EL element 1 including the threshold value correction operation and the movement degree correction operation as the light emission driving operation of one cycle in one frame period.

Due to the threshold value correction operation, a current according to the signal voltage Vsig can be given to the organic EL element 1 regardless of variation in the threshold voltage Vth of the driving transistor Td, fluctuation of the threshold voltage Vth caused by a temporal change, and the like in each pixel circuit 10. Consequently, by cancelling the variation of the threshold voltage Vth appearing in manufacturing or caused by a temporal change, high image quality can be maintained without causing luminance unevenness or the like on the screen.

In addition, since a drain current changes even due to the degree of movement of the driving transistor Td, image quality deteriorates due to variation in the degree of movement of the driving transistor Td of each of the pixel circuits 10, but due to correction of the degree of movement, the source voltage Vs is obtained according to the magnitude of the degree of movement of the driving transistor Td. As a result, the voltage is adjusted to be the inter-gate-source voltage Vgs that is likely to absorb the variation of the degree of the movement of the driving transistor Td of each of the pixel circuits 10, and therefore, deterioration of image quality caused by the variation in the degree of movement is also resolved.

Note that, although the example in which the threshold value correction is performed once has been described for the sake of simplification of illustration and description in FIG. 3, the threshold value correction may also be performed by being divided into a plurality of operations as described above. In such a case, before writing of the video signal voltage Vsig indicated in the period LT3 of FIG. 3 is performed, the operation of setting the scanning pulse WS to be on is performed a plurality of times when the voltage of the signal line DTL reaches the reference voltage Vofs.

The threshold value correction operation is divided into a plurality of operations and then performed in the operation of the pixel circuit of one cycle according to the demand for speed-up (high frequency) of a display device.

Since an operation time of a pixel circuit becomes shorter in relation to the progress of a high frame rate, it is not possible to secure a continuous threshold value correction period (the period in which the signal line voltage=the reference voltage Vofs). In this case, by securing periods necessary for the threshold value correction period by performing the threshold value correction operation in a time division manner, the inter-gate-source voltage of the driving transistor Td is made to converge on the threshold voltage Vth.

The above description is the overview of the configuration of the organic EL display device and the operation performed when an image is to be displayed. It is ascertained that image quality is greatly affected by the value of Ids of formula 1. In addition, interference fringes are observed in the organic EL display device.

2. Regarding Occurrence of Interference Fringes

Causes of visual recognition of interference fringes will be described using FIG. 4. The interference fringes mentioned herein refer to fringe patterns appearing on a screen caused by light emission variation (light emission unevenness). FIG. 4 shows cases in which it is possible and not possible to visually recognize interference fringes. FIG. 4A shows the case in which it is not possible to visually recognize the interference fringes, and FIG. 4B shows the case in which the interference fringes can be visually recognized.

As shown in the upper diagram of FIG. 4A, the interference fringes are not visually recognized on the screen. The lower diagram of FIG. 4A shows conditions for this case. Here, Vgs, Ids, and Vds respectively indicate the inter-gate-source voltage of the driving transistor Td, the inter-drain-source current, and the inter-drain-source voltage. Vds is fixed to 10 V. The drawing shows changes of the value of the current ratio (Ids) at nine points on a display screen by changing the value of Vgs in this state from 0.6 to 3.0 as shown on the right end. The current ratio (on the vertical axis of the graph) is obtained by normalizing 100% at the center. In this case, cycles of a wavelength are set to be small as a whole as indicated by the curved line with an arrow in the graph. At this time, interference fringes are not visually recognized on the screen as shown in the upper diagram of FIG. 4A. Note that the positions of the nine points correspond to the recess portions of the wave.

On the other hand, as shown in the upper diagram of FIG. 4B, interference fringes can be visually recognized on the screen. In this case, the cycles of a wavelength are great and span over a plurality of pixels as indicated by the curved line with an arrow in the graph in the lower diagram of FIG. 4B. At this time, interference fringes are visually recognized on the screen as shown in the upper diagram of FIG. 4B.

Based on the above description, it is understood that interference fringes do not easily appear when the value of Ids changes periodically with a small wavelength with respect to pixels.

3. Regarding an MTF of a Human Eye

A modulation transfer function (MTF) of a human eye will be described using FIG. 5. The MTF represents the relation between a spatial frequency and a contrast (light-darkness ratio), and is called a spatial frequency characteristic. When the relation is considered in terms of the human eye, a certain relation between a spatial frequency and an ability of perception of the human eye is shown.

Figure 5:
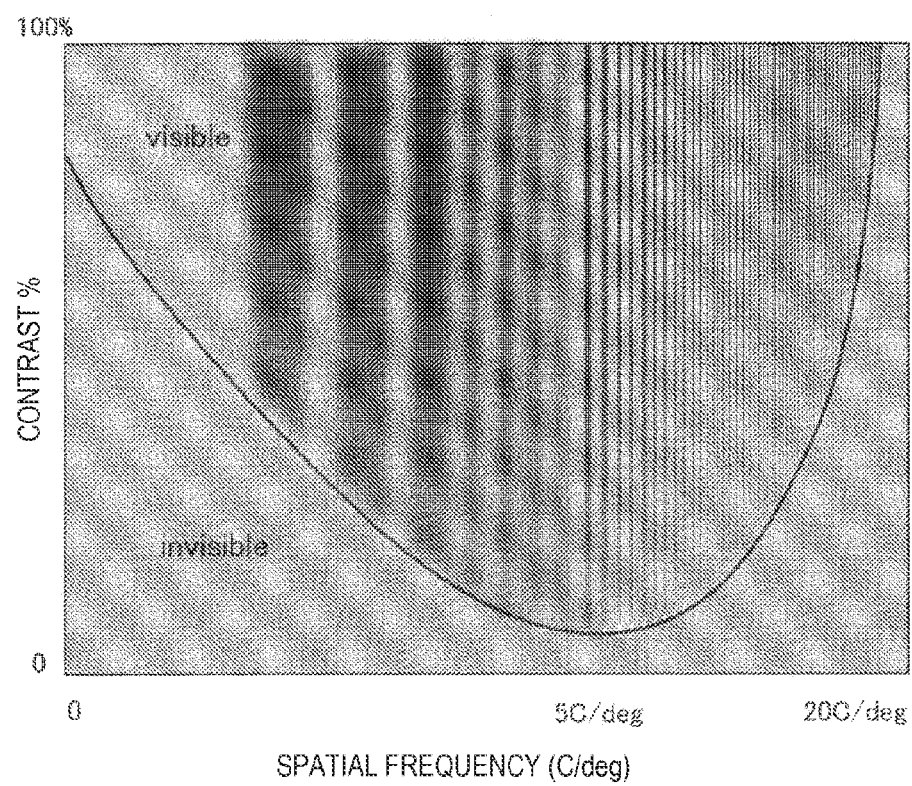
FIG. 5 is a diagram showing the relation between space frequencies and contrasts.

FIG. 5 relates to a spatial frequency characteristic of the human eye. Herein, the horizontal axis represents spatial frequency (c/deg) and the vertical axis represents contrast (%). The scale is a logarithmic scale.

Spatial frequency refers to fineness of fringes, representing the number of fringes per unit length (one degree of vision). Thus, if the interval of fringes is set to w degrees, a frequency $u=1/w$ (cycles/degree, c/deg) is satisfied.

Contrast refer to light-darkness ratios of black and white, and is expressed by amplitude/average luminance. Since an amplitude=(maximum luminance−minimum luminance)/2 and the average luminance=(maximum luminance+minimum luminance)/2, a contrast %=(maximum luminance−minimum luminance)/(maximum luminance+minimum luminance)×100(%) is defined.

As shown in FIG. 5, as the spatial frequency characteristic of the human eye, the characteristic that contrasts are lowered in low frequency regions and high frequency regions is shown. In brief, this characteristic means that wispy fringe patterns and fine fringe patterns are difficult to see and fringes in the vicinity of about 5 c/deg are most easily seen. The human eye is not able to recognize fringe patterns (interference fringes) in the lower region of the curved line. The upper region is shown as being recognized by the human eye.

Thus, if the lower region of the characteristic curve of FIG. 5 is set by adjusting the value of a spatial frequency and a contrast %, fringe patterns are considered to become more difficult to see.

4. Embodiments

Figure 6:
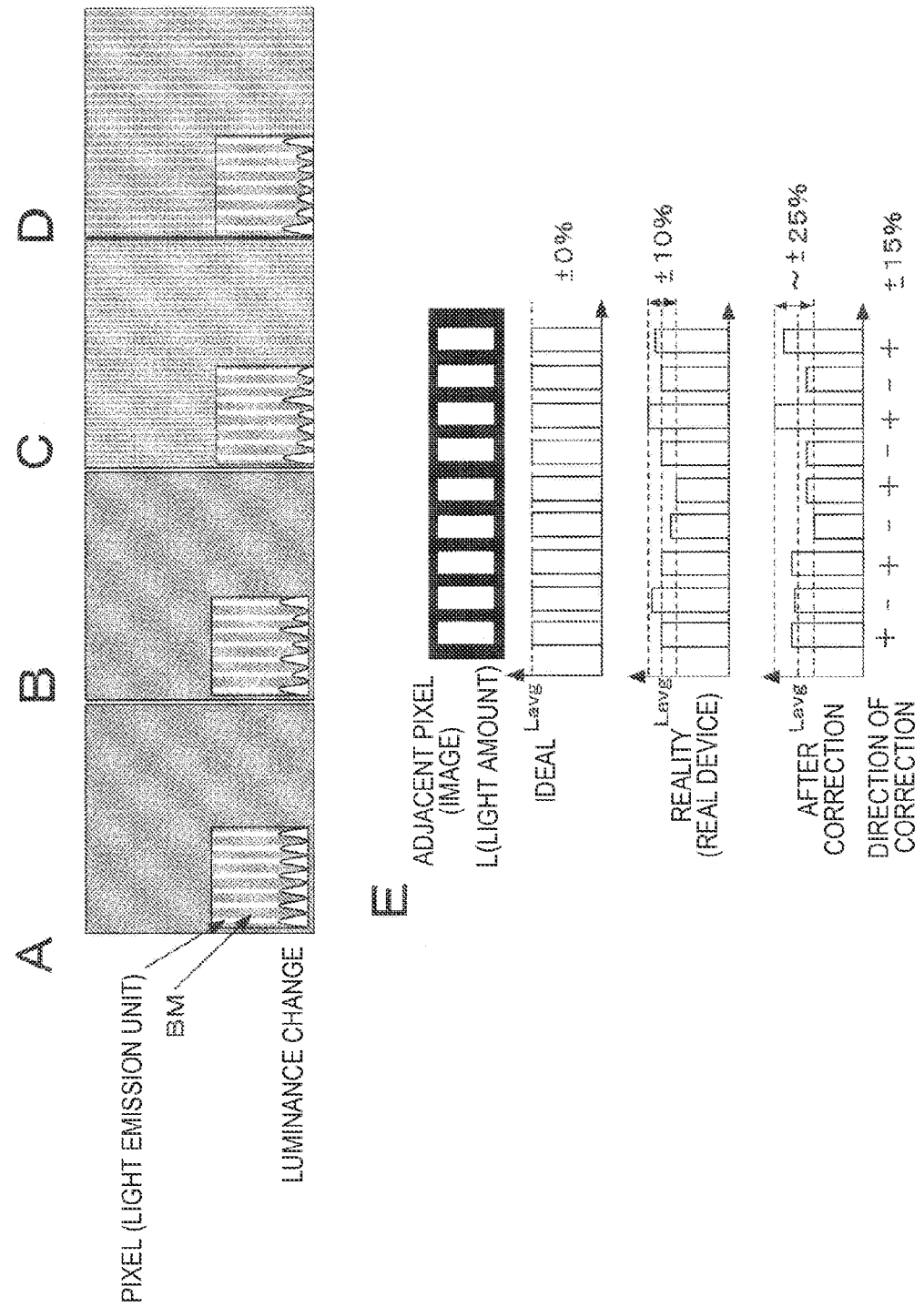
FIG. 6 is a diagram showing a way in which an image is viewed based on a characteristic of a space frequency.

A technique for making interference fringes appearing on the screen of a display device difficult to see will be described using FIG. 6. FIGS. 6A to 6D show changes of light emission (luminance) of pixels and display states of interference fringes on the screen, showing experimental results of the way that the interference fringes appear on the screen when the light emission states of the pixels are changed in a predetermined cycle.

FIG. 6A shows the case in which there is no light emission variation. As shown in FIG. 6A, no interference fringes are recognized. This is a so-called ideal state. Actually, variation is unavoidably present in luminance of each pixel, and the ideal state is regarded as being difficult to realize.

FIG. 6B shows a case in which there is light emission variation and the cycle thereof is short. As shown in FIG. 6B, interference fringes are not seen and thus a human is not able to recognize them.

On the other hand, FIGS. 6C and 6D show cases of light emission states with variation in which the cycle is somewhat long. The light emission states are normal states. In other words, they are states of light emission variation of a display device that is manufactured and completed normally. In that case, interference fringes can be clearly recognized.

As shown in FIG. 6A, the state with no light emission variation (luminance) of each pixel is ideal, and it is most desirable if this state can be realized. In reality, however, this state is difficult to realize since pixels have variation in their luminance. On the other hand, in the experiment performed this time, interference fringes can be recognized in FIGS. 6C and 6D, but in the display state of FIG. 6B in which a short cycle of luminance has been set, interference fringes are not recognized. This is considered to be due to the fact that the cycle of luminance exceeds resolution of the human eye. Thus, interference fringes are considered to be concealed (invisible) if the state can be realized. This (making interference fringes invisible in the state of FIG. 6B) is supported by the spatial frequency characteristic (MTF) of the human eye described above.

FIG. 6E schematically shows the size of the amount of light emission of each pixel and the size of the amount of light emission after correction. As shown in the drawing, light emission variation in the ideal state is ±0%, and thus no light emission variation is present. This state corresponds to the state of FIG. 6A.

On the other hand, light emission variation with respect to the amount of light emission is present in nine adjacent pixels in an actual device as shown in the drawing. Herein, the case in which a maximum of about ±10% of variation is present is shown as an example. The state corresponds to the states of FIGS. 6C and 6D. Thus, if the state of FIG. 6B can be set by adding (correcting) variation of light emission to the real light emission state and shortening the cycle of luminance (heightening the spatial frequency), interference fringes are considered to be made invisible.

Thus, by applying greater offset (for example, ±15%) than the original light emission variation (for example, ±10%) to the adjacent pixels in an alternating manner, light emission variation (convex-concave) with a cycle shorter than the original cycle can be finally created as shown in the lower diagram of FIG. 6E. Thereby, the state of FIG. 6B can be set.

In this case, the state has light emission variation of ±25% from the state of FIG. 6A. As described above, by making periodic high-low differences in light emission states in the adjacent pixels, and causing light emission variation with a cycle shorter than the original cycle, and thereby realizing the state of FIG. 6B, interference fringes are considered to be made invisible.

As a general method for removing interference fringes caused by light emission variation, variation in the value of Ids (an inter-drain-source current) in formula 1 described above is reduced (accordingly light emission variation is reduced), and thus a state approximates the state of FIG. 6A.

The method used herein, however, is to make interference fringes invisible by setting the state of FIG. 6B by shortening the cycle of light emission variation (heightening the spatial frequency) while increasing overall light emission variation by correcting the original light emission variation.

Various methods are considered as specific methods of making correction to variation of a light emission state. A light emission amount is fundamentally decided with the magnitude of Ids (the inter-drain-source current) in formula 1 described above. For this reason, it can be realized by intentionally changing Ids.

In addition, a light emission state can also be indirectly adjusted. For example, it can be realized by changing a pixel width or the like. Hereinbelow, various control and adjustment methods will be described.

<4-1. Change of a Characteristic of a Driving Transistor Using an Excimer Laser>

As described above, variation of a light emission state can be changed by changing Ids of the driving transistor Td (TFT). Herein, a method of changing Ids by changing the characteristic of the TFT using excimer laser annealing will be described using FIG. 7.

In the manufacturing process of the TFT, an excimer laser is radiated to an amorphous (non-crystalline) silicon film formed on a glass substrate (which is called laser annealing) to perform modification to polysilicon. With the modification to polysilicon, a TFT with an excellent characteristic can be formed.

The size of radiation energy of the excimer layer can be used to adjust the degree of movement µ of the TFT. If the degree of movement µ can be adjusted, Ids of formula 1 can be adjusted.

Figure 7:
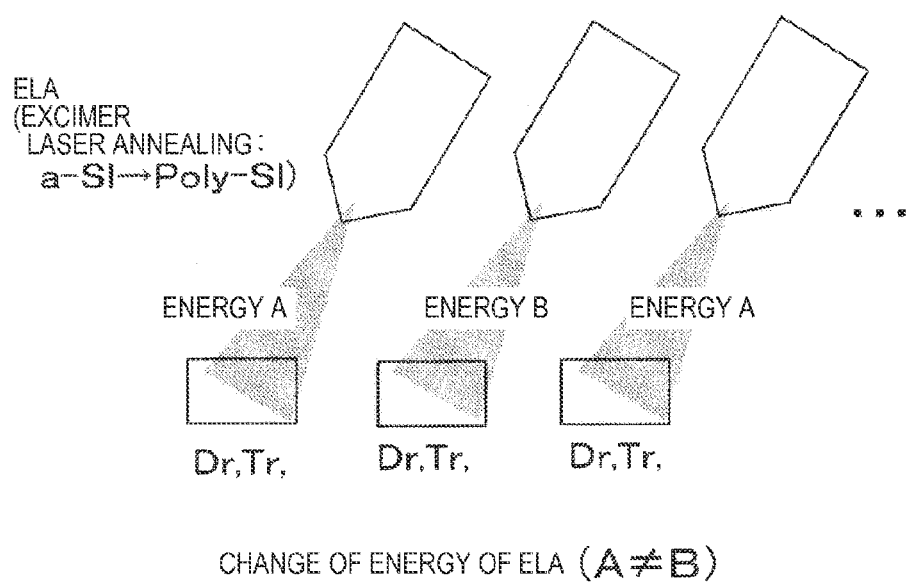
FIG. 7 is an illustrative diagram showing a method of changing a characteristic of a driving transistor using an excimer laser.

As shown in FIG. 7, the energy of the laser annealing for modifying the amorphous silicon to polysilicon is changed for each of TFTs on the same line in a display device.

Accordingly, a predetermined amount of variation, for example, variation of ±15%, can be intentionally added to the variation (for example, ±10%) of the original Ids, and at the same time, it can be set as variation with a cycle shorter than the cycle of the change of the original Ids. Accordingly, interference fringes can be made difficult to see.

<4-2. Change of a Channel Width of a Driving Transistor>

If the channel width W of the driving transistor Td (TFT) is changed based on formula 1, Ids is changed. Thus, if the channel width W of the TFT is changed, a light emission state can be changed.

Figure 8:
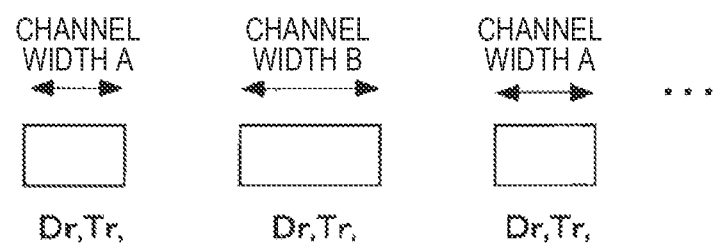
FIG. 8 is an illustrative diagram showing a method of changing a channel width of a driving transistor.
Figure 9:
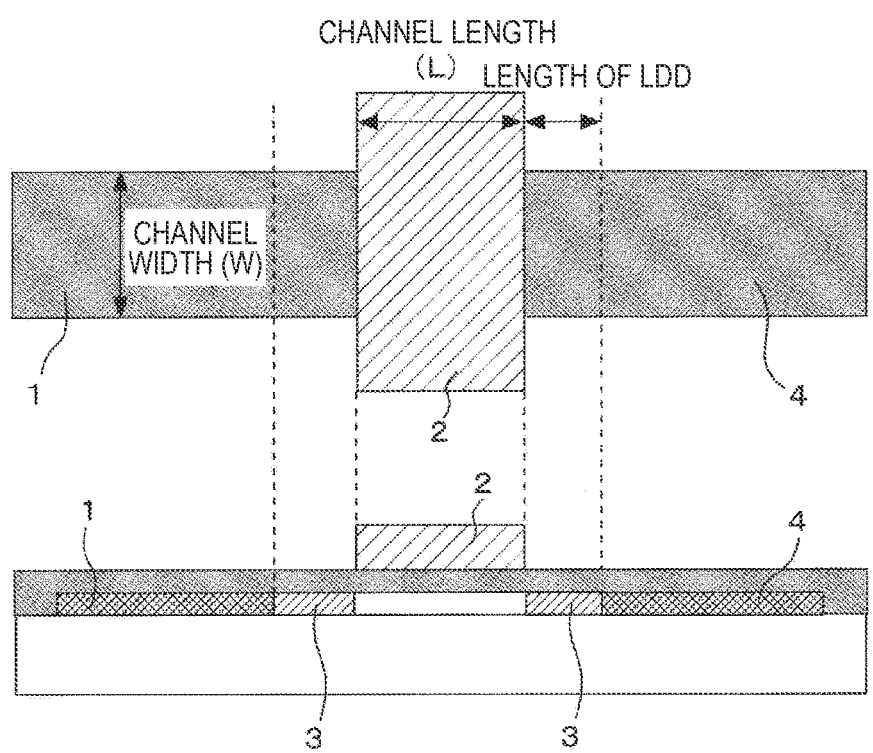
FIG. 9 is a structural diagram of the driving transistor.

Thus, the change of the channel width W of the TFT will be described using FIGS. 8 and 9. FIG. 8 shows a conceptual diagram when the channel width W of a TFT is changed. FIG. 9 shows a structural diagram of a TFT.

As shown in FIG. 8, the channel width W is changed for each TFT on the same line inside a display device. Due to the change of W, Ids is changed. Since the channel width is set to the design value of the TFT, it can be adjusted by adding a predetermined value to the original design value.

Accordingly, the predetermined amount of variation, for example, variation of ±15%, can be intentionally added to the variation of the original Ids (for example, ±10%). At the same time, it can be set as variation with a cycle shorter than the cycle of the change of the original Ids. Accordingly, interference fringes can be made difficult to see.

A channel length L may also be changed. Ids, however, is inversely proportional to the channel length L, and thus, in this case, the same effect as the adjustment of the channel width W is obtained by subtracting a predetermined value therefrom.

The structure of the TFT will be briefly described using FIG. 9. The lower diagram of FIG. 9 is a cross-sectional view of the TFT. The upper diagram of FIG. 9 is a top view thereof. A drain region 1 and a source region 4 are formed on the left and right sides of the substrate and a gate electrode 2 is disposed in the middle thereof. A channel width W refers to the width of the drain region 1 in the vertical direction. A channel length refers to the length of the gate electrode 2 in the horizontal direction. An lightly dopedDrain (LDD) 3 reduces the hot carrier effect, constitutes the drain region 1 and the source region 4 with two kinds of impurity regions of a low impurity concentration region and a high impurity region, and thereby suppresses the occurrence of hot carriers.

<4-3. Change of a Pixel Width>

A light emission state of pixels can be changed by changing a pixel width. The change of a pixel width will be described using FIG. 10.

Figure 10:
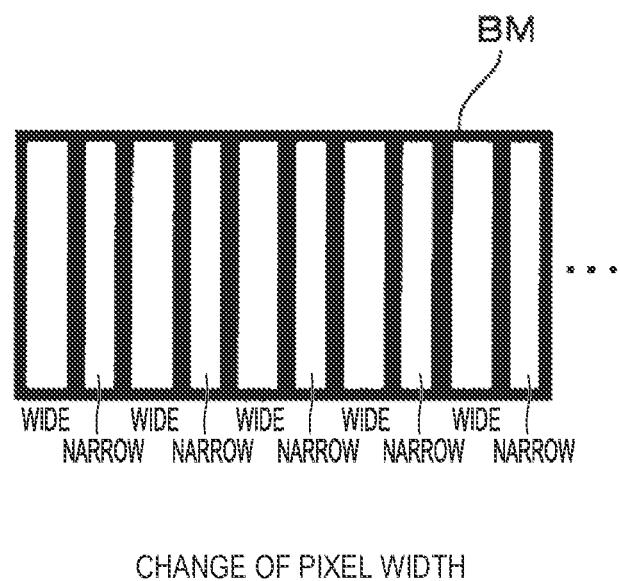
FIG. 10 is an illustrative diagram showing changes of a pixel width.

As shown in FIG. 10, variation of a light emission state of each pixel is adjusted by varying the width of a black matrix (BM). The width of the BM is adjusted for each of pixels on the same line in a display device. Since the width is set to a design value, it can be adjusted by adding a predetermined value to the original design value. This method is to indirectly control a light emission state by adjusting the width of the BM for each pixel already emitting light with predetermined luminance, rather than changing an amount of light emission by adjusting Ids.

Accordingly, the predetermined amount of variation, for example, variation of ±15%, can be intentionally added to the original light emission variation (for example, ±10%). At the same time, it can be set as variation with a cycle shorter than the cycle of the change of the original light emission state. Accordingly, interference fringes can be made difficult to see. In FIG. 10, the term "wide" in "wide and narrow" means heightening luminance, and the term "narrow" in "wide and narrow" means lowering luminance.

<4-4. Change of the Transmittance of Color Filters>

Figure 11:
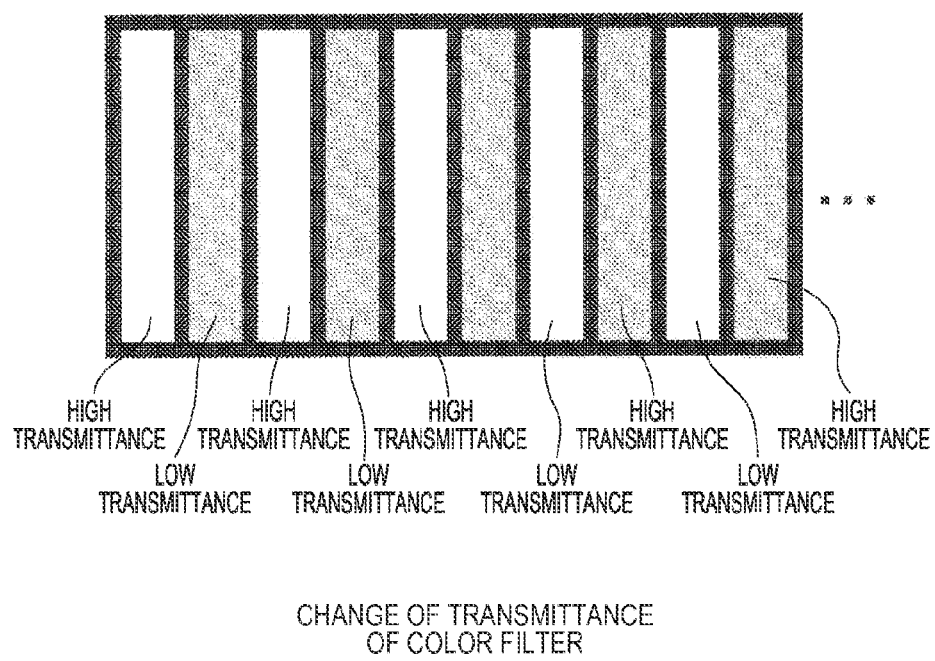
FIG. 11 is a diagram showing changes of a transmittance of a color filter.

Light emission variation can be adjusted by changing the transmittance of color filters. The change of the transmittance of color filters will be described using FIG. 11. As shown in FIG. 11, the transmittance of color filters disposed for each of pixels on the same line in a display device is adjusted. Since the value is set to the design value, the transmittance can be adjusted by adding a predetermined value to the original design value.

Accordingly, the predetermined amount of variation, for example, variation of ±15%, can be intentionally added to the original light emission variation (for example, ±10%). At the same time, it can be set as variation with a cycle shorter than the cycle of the change of the original light emission state. Accordingly, interference fringes can be made difficult to see. In FIG. 11, raising the transmittance means heightening luminance, and reducing the transmittance means lowering luminance.

<4-5. Change of a Signal Voltage Using a Horizontal Selector>

A light emission state can be changed by changing a voltage of the signal lines DTL of the driving transistor Td (TFT). The change of the voltage of the signal lines DTL will be described using FIG. 12. FIG. 12A shows the case in which a predetermined voltage is applied to the voltage of the signal lines DTL. FIG. 12B shows the case in which a predetermined voltage is applied to the voltage of the signal lines DTL which has already been supplied to a display device.

First, description will be provided from FIG. 12A.

As shown in FIG. 12A, a predetermined voltage may be applied to each output voltage of the horizontal selector 11, i.e., the voltage of the signal lines DTL. Accordingly, the predetermined amount of variation, for example, variation of ±15%, can be intentionally added to the original light emission variation (for example, ±10%). At the same time, it can be set as variation with a cycle shorter than the cycle of the change of the original light emission state. Accordingly, interference fringes can be made difficult to see. The value of the added variation is decided based on the original light emission variation.

In addition, the following methods are considered as specific methods of adding variation.

(a) Positive (+) variation is added to the signal lines DTL1, DTL3, DTL5, . . . , and DTLn−1, and negative (−) variation is added to the signal lines DTL2, DTL4, DTL6, . . . , and DTLn.

(b) Positive (+) variation is added to the signal lines DTL1, DTL3, DTL5, . . . , and DTLn−1, and zero (0) variation is added to the signal lines DTL2, DTL4, DTL6, . . . , and DTLn.

(c) Zero (0) variation is added to the signal lines DTL1, DTL3, DTL5, . . . , and DTLn−1, and positive (+) variation is added to the signal lines DTL2, DTL4, DTL6, . . . , and DTLn.

Furthermore, the variation may be added by alternately changing the signal lines DTL for each frame signal in each method described above. In other words, in the example of (a), variation is added for the first frame using the method described above, and for the next frame, positive (+) variation is added to the signal lines DTL2, DTL4, DTL6, . . . , and DTLn and negative (−) variation is added to the signal lines DTL1, DTL3, DTL5, . . . , and DTLn−1. This operation is repeated for each frame in an alternating manner. The same method is also considered in (b) and (c).

Next, FIG. 12B will be described.

As shown in FIG. 12B, a capacitor C1 is connected to the signal lines DTL1, 3, . . . of the horizontal selector 11 via an amplifier A1. Accordingly, offset can be given to the voltage of the signal lines DTL1, 3, . . . which have already been supplied to the display device. Thus, the voltage of the signal lines DTL1, 3, . . . which are connected to the capacitor C1 becomes high and the voltage of the signal lines DTL2, 4, . . . which are not connected to the capacitor C1 becomes low. Accordingly, the predetermined amount of variation, for example, variation of ±15%, can be intentionally added to the original light emission variation (for example, ±10%). At the same time, it can be set as variation with a cycle shorter than the cycle of the change of the original light emission state. Accordingly, interference fringes can be made difficult to see. The value of the added variation is decided based on the original light emission variation, not being limited to ±15%. In addition, the capacitor C1 may be configured to be connected to the connection signal lines DTL2, 4, . . . and a decoupling switch to the signal lines DTL1, 3, . . . .

As shown in FIG. 12B, the decoupling switch SW1 passing through A2 is connected in order to set the signal lines DTL to be floating. If the horizontal selector 11 is configured to be floating, the decoupling switch SW1 is not necessary.

The change of the voltage of the signal lines DTL by the horizontal selector 11 is relatively easily evaluated because no changes in the manufacturing process or design of the driving transistor Td are necessary, and a reliable effect brought by luminance adjustment (the effect of the change of Ids) is expected to be obtained. For these reasons, in order to suppress interference fringes using periodicity of luminance of the display device, it is preferable to change the setting of the voltage of the signal lines DTL of the horizontal selector 11.

5. Application Examples to Other Electronic Apparatuses and a Modified Example Hereinabove, the embodiment has been described, however, the configuration of the display device described above is an example, and the configuration of pixels is also an example. The technology of the present disclosure can be applied to device configurations used in various kinds of display devices.

In addition, the present disclosure can be widely applied to any of various kinds of display devices.

Figure 13:
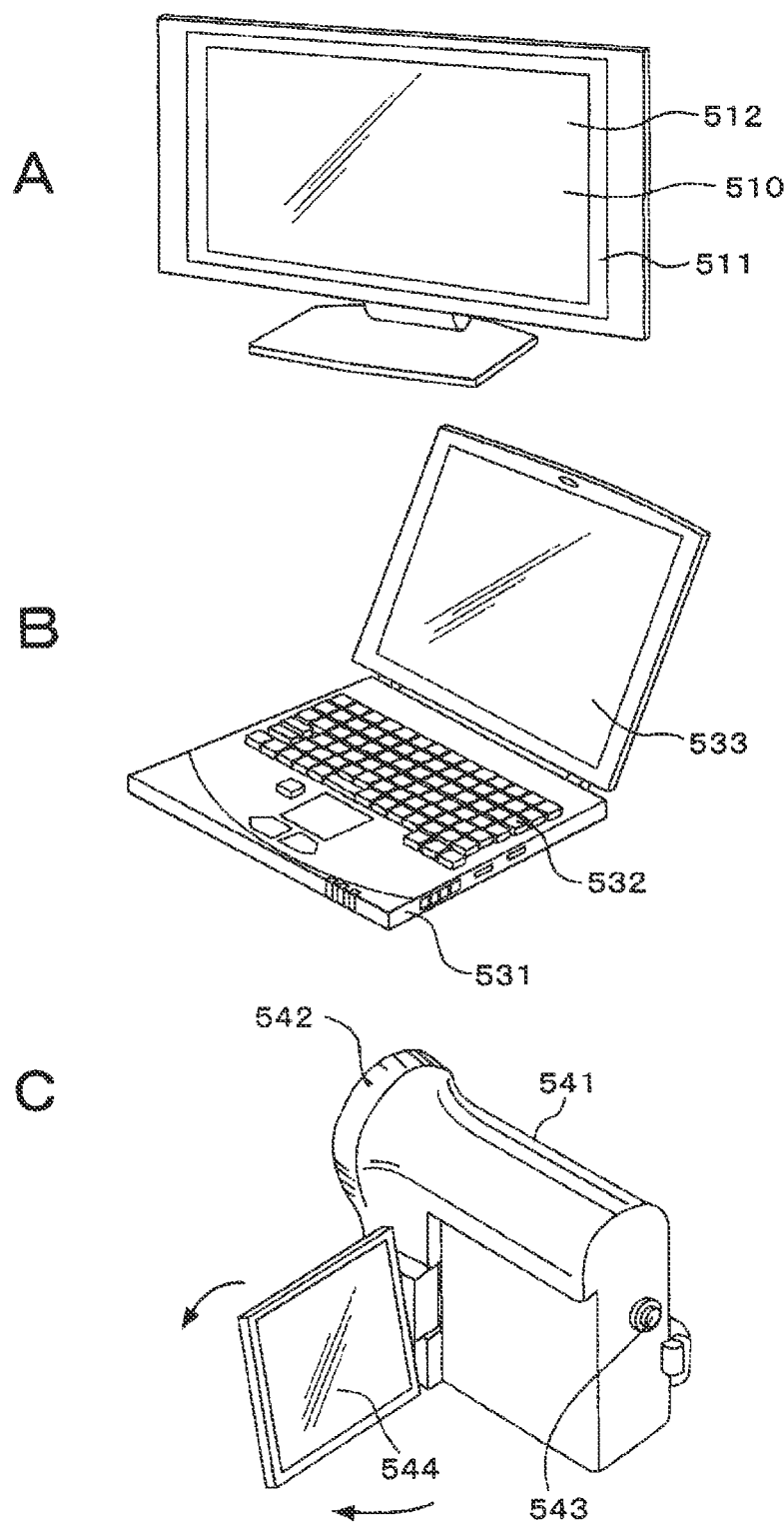
FIG. 13 is an illustrative diagram of electronic apparatuses as application examples of an embodiment.
Figure 14:
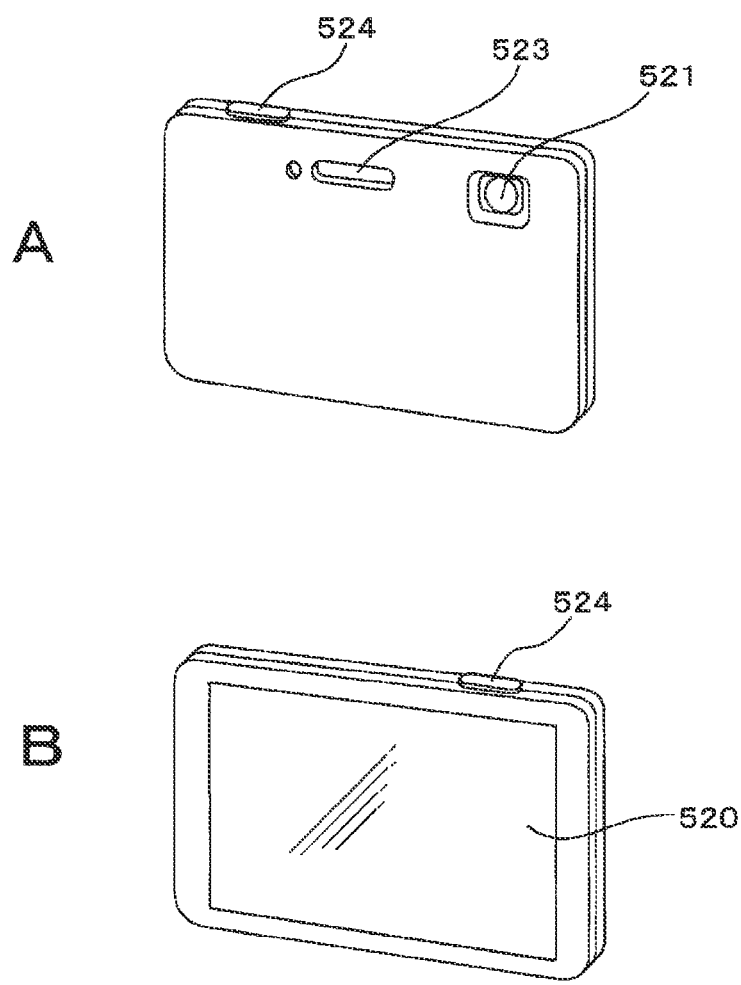
FIG. 14 is an illustrative diagram of an electronic apparatus as an application example of an embodiment.

Next, application examples of the display device described in the embodiment will be described with reference to FIGS. 13 to 15. The display device of the embodiment can be applied to electronic apparatuses of all fields which display video signals input from outside or generated in the inside as images or videos, including a television device, a digital camera, a notebook-type personal computer, a mobile terminal device such as a mobile telephone, a video camera, and the like.

Application Example 1

FIG. 13A shows the external appearance of a television device to which the display device of the embodiment is applied. The television device has, for example, a video display screen unit 510 that includes a front panel 511 and a filter glass 512, and the like, and the video display screen unit 510 is configured as the display device according to the embodiment.

Application Example 2

FIG. 13B shows the external appearance of a notebook-type personal computer to which the display device of the embodiment is applied. The notebook-type personal computer has, for example, a main body 531, a keyboard 532 for operating inputs of text and the like, a display unit 533 that displays images, and the like, and the display unit 533 is configured as the display device according to the embodiment.

Application Example 3

FIG. 13C shows the external appearance of a video camera to which the display device of the embodiment is applied. The video camera has, for example, a main body unit 541, a lens 542 for imaging subjects provided on the front face of the main body unit 541, a start-stop switch 543 used during imaging, and a display unit 544, and the display unit 544 is configured as the display device according to the embodiment.

Application Example 4

FIGS. 14A and 14B show the external appearance of a digital camera to which the display device of the embodiment is applied. FIG. 14A shows the external appearance of the front side and FIG. 14B shows the external appearance of the back side. The digital camera has, for example, a display unit with a touch panel 520, an imaging lens 521, a light emission unit 523 for flash, a shutter button 524, and the like, and the display unit 520 is configured as the display device according to the embodiment.

Application Example 5

FIG. 15 shows the external appearance of a mobile telephone to which the display device of the embodiment is applied. FIG. 15A shows an operation face and a display face in the state of the open housing, FIG. 15B shows the upper-face side in the state of the closed housing, and FIG. 15C shows the bottom-face side in the state of the closed housing. FIGS. 15D and 15E are perspective views taken from the upper-face side and the bottom-face side in the state of the closed housing.

The mobile telephone is formed of, for example, an upper housing 550 and a lower housing 551 which are joined by a joining unit (hinge unit) 556, and has a display 552, a sub display 553, a key operation unit 554, a camera 555, and the like. The display 552 and the sub display 553 are configured as the display device according to the embodiment.

Additionally, the present technology may also be configured as below.

(1)

A display device including:

a pixel array unit in which a plurality of pixels are arrayed in a matrix shape, wherein a predetermined amount of light emission variation is added to a light emission state of each pixel and a cycle of the light emission state of the pixel array unit in the case of the addition is shorter than the cycle of a light emission state of the pixel array unit before the predetermined amount of light emission variation is added.

(2)

The display device according to (1), wherein the addition of the light emission variation is made by adjusting an inter-drain-source current of a driving transistor.

(3)

The display device according to (2), wherein the adjustment of the inter-drain-source current of the driving transistor is made by changing a channel width.

(4)

The display device according to (2) or (3), wherein the adjustment of the inter-drain-source current of the driving transistor is made by adjusting radiation energy of an excimer laser in a manufacturing process of the driving transistor.

(5)

The display device according to (1), wherein the addition of the light emission variation is made by adjusting a pixel width.

(6)

The display device according to (1) or (5), wherein the addition of the light emission variation is made by adjusting a transmittance of a color filter.

REFERENCE SIGNS LIST 1 organic EL element
10 pixel circuit
11 horizontal selector
12 drive scanner
13 write scanner
20 pixel array unit
Cs retention capacitor
Ts sampling transistor
Td driving transistor
510 video display screen unit
511 front panel
512 filter glass
520 display unit
521 imaging lens
523 light emission unit
524 shutter button
531 main body
532 keyboard
533 display unit
541 main body unit
542 lens
543 start-stop switch
544 display unit
550 upper housing
551 lower housing
552 display
553 sub display
554 key operation unit
555 camera

The invention claimed is:

1. A display device comprising:
a pixel array unit in which a plurality of pixels are arrayed in a matrix shape,
wherein a predetermined amount of light emission variation is configured to be added to a light emission state of each pixel, and a state of variation of a light emission state of the pixel array unit when the variation is added corresponds to at least any one of
(1) a state in which a cycle of the light emission state is shorter than a cycle of the light emission state of the pixel array unit before the predetermined amount of light emission variation is added, and
(2) a state in which the variation of the light emission state is greater than variation of the light emission state of the pixel array unit before the predetermined amount of light emission variation is added, and
wherein the relation of a spatial frequency and a contrast of the variation of the light emission state of the pixel array unit is set to be in the range in which it is not possible to recognize fringe patterns.

2. The display device according to claim 1, wherein the predetermined amount of light emission variation is configured to be added to the light emission state of each pixel, and the cycle of the variation of the light emission state of the pixel array unit in the case of the addition is shorter than the cycle of the light emission state of the pixel array unit before the predetermined amount of light emission variation is added.

3. The display device according to claim 1, wherein the predetermined amount of light emission variation is configured to be added to the light emission state of each pixel, and the variation of the light emission state of the pixel array unit in the case of the addition is greater than the variation of the light emission state of the pixel array unit before the predetermined amount of light emission variation is added.

4. The display device according to claim 1, wherein the addition of the light emission variation is made by adjusting an inter-drain-source current of a driving transistor.

5. The display device according to claim 4, wherein the adjustment of the inter-drain-source current of the driving transistor is made by changing a channel width.

6. The display device according to claim 4, wherein the adjustment of the inter-drain-source current of the driving transistor is made by adjusting radiation energy of an excimer laser in a manufacturing process of the driving transistor.

7. The display device according to claim 1, wherein the addition of the light emission variation is made by adjusting a pixel width.

8. The display device according to claim 1, wherein the addition of the light emission variation is made by adjusting a transmittance of a color filter.

9. The display device according to claim 1, wherein the addition of the light emission variation is made by adjusting a signal line voltage.

10. An electronic apparatus comprising: a display device according to claim 1, wherein the display device is configured to display a video signal input from outside or a video signal generated in the inside.

11. An electronic apparatus comprising:
a display device,
wherein the display device includes a pixel array unit in which a plurality of pixels are arrayed in a matrix shape, and
wherein a predetermined amount of light emission variation is added to a light emission state of each pixel, and a cycle of the light emission state of the pixel array unit in the case of the addition is shorter than the cycle of the light emission state of the pixel array unit before the predetermined amount of light emission variation is added.

12. A display device comprising:
a pixel array unit in which a plurality of pixels are arrayed in a matrix shape,
wherein a predetermined amount of light emission variation is configured to be added to a light emission state of each pixel, and
wherein the relation of a spatial frequency and a contrast of variation of the light emission state of the pixel array unit is set to be in the range in which it is not possible to recognize a fringe pattern.

13. The display device according to claim 12, wherein the predetermined amount of light emission variation is added to each of pixels in each row of the pixel array unit by changing at least one factor among:
(1) a degree of movement or a channel width of a transistor configured to drive the pixel;
(2) a pixel width of the pixel;
(3) a transmittance of a color filter corresponding to the pixel; and
(4) a reference value of a signal voltage supplied to the pixel.

14. The display device according to claim 13, wherein the predetermined amount of light emission variation is added to each of the pixels in each row of the pixel array unit by changing the degree of movement or the channel width of the transistor configured to drive the pixel.

15. The display device according to claim 13, wherein the predetermined amount of light emission variation is added to each of the pixels in each row of the pixel array unit by changing the pixel width of the pixel.

16. The display device according to claim 13, wherein the predetermined amount of light emission variation is added to each of the pixels in each row of the pixel array unit by changing the transmittance of the color filter corresponding to the pixel.

17. The display according to claim 13, wherein the predetermined amount of light emission variation is added to each of the pixels in each row of the pixel array unit by changing the reference value of the signal voltage supplied to the pixel.

* * * * *